United States Patent
Ogasawara et al.

(10) Patent No.: US 8,710,132 B2
(45) Date of Patent: Apr. 29, 2014

(54) FLAME-RETARDANT POLYAMIDE COMPOSITION

(75) Inventors: Hideto Ogasawara, Ichihara (JP); Masashi Seki, Sodegaura (JP)

(73) Assignee: Mitsui Chemicals, Inc., Minato-Ku, Tokyo (JP)

( * ) Notice: Subject to any disclaimer, the term of this patent is extended or adjusted under 35 U.S.C. 154(b) by 611 days.

(21) Appl. No.: 12/513,570

(22) PCT Filed: Nov. 19, 2007

(86) PCT No.: PCT/JP2007/072383
§ 371 (c)(1),
(2), (4) Date: May 5, 2009

(87) PCT Pub. No.: WO2008/062755
PCT Pub. Date: May 29, 2008

(65) Prior Publication Data
US 2010/0076137 A1      Mar. 25, 2010

(30) Foreign Application Priority Data
Nov. 20, 2006   (JP) ................................. 2006-312576

(51) Int. Cl.
C08K 3/38  (2006.01)
C08K 3/10  (2006.01)

(52) U.S. Cl.
USPC ........... 524/405; 524/406; 524/409; 524/410; 524/417; 524/434; 524/607

(58) Field of Classification Search
USPC ......... 524/408, 409, 464, 405, 406, 410, 417, 524/434, 607; 525/416; 528/397, 339
See application file for complete search history.

(56) References Cited

U.S. PATENT DOCUMENTS

| | | | |
|---|---|---|---|
| 6,235,844 B1 * | 5/2001 | Dadgar et al. ................. | 525/184 |
| 2002/0040089 A1 * | 4/2002 | Ouchi ........................... | 524/464 |
| 2002/0061983 A1 * | 5/2002 | Kolich et al. ............... | 525/333.4 |
| 2002/0086928 A1 * | 7/2002 | Ouchi ........................... | 524/409 |
| 2009/0069478 A1 * | 3/2009 | Seki et al. .................... | 524/405 |
| 2009/0069479 A1 * | 3/2009 | Seki ............................. | 524/405 |

FOREIGN PATENT DOCUMENTS

| | | | | |
|---|---|---|---|---|
| CA | 2019904 A1 * | 7/1989 | | |
| CA | 2019904 A1 | 1/1991 | | |
| EP | 0 376 616 A | 7/1990 | | |
| EP | 376616 A2 * | 7/1990 | ............... | C08K 7/02 |
| JP | 2-173047 A | 7/1990 | | |
| JP | 3-066755 A | 3/1991 | | |
| JP | 8-259808 A | 10/1996 | | |
| JP | 10-072550 A | 3/1998 | | |
| JP | 10072550 A * | 3/1998 | ............... | C08L 77/10 |
| JP | 10-219026 A | 8/1998 | | |
| JP | 2000-212437 A | 8/2000 | | |
| JP | 2002-146184 A | 5/2002 | | |
| JP | 2003-082228 A | 3/2003 | | |
| WO | WO 2006/112205 A1 | 10/2006 | | |
| WO | WO 2006112205 A1 * | 10/2006 | | |

OTHER PUBLICATIONS

Machine translation of JP 10-072550.*
Form PCT/ISA/210 (International Search Report) dated Feb. 12, 2008.

* cited by examiner

Primary Examiner — Robert D. Harlan
(74) Attorney, Agent, or Firm — Buchanan Ingersoll & Rooney PC

(57) ABSTRACT

Disclosed is a flame-retardant polyamide composition excellent in fluidity during molding and granulation ability on a twin-screw extruder or the like. A molded article produced from the composition is excellent in mechanical properties including stiffness, heat resistance and flame retardancy during a reflow soldering process, and shows low warpage. Specifically disclosed is a flame-retardant polyamide composition comprising 20 to 80 mass % of a specific polyamide resin (A), 1 to 40 mass % of a flame retardant (B), 5 to 60 mass % of a glass fiber (C), and 0.5 to 5 mass % of an auxiliary flame retardant (D), which can be molded in an article having reduced warpage. Preferably, the glass fiber (C) has a cross section having an aspect ratio of greater than 3.

8 Claims, 1 Drawing Sheet

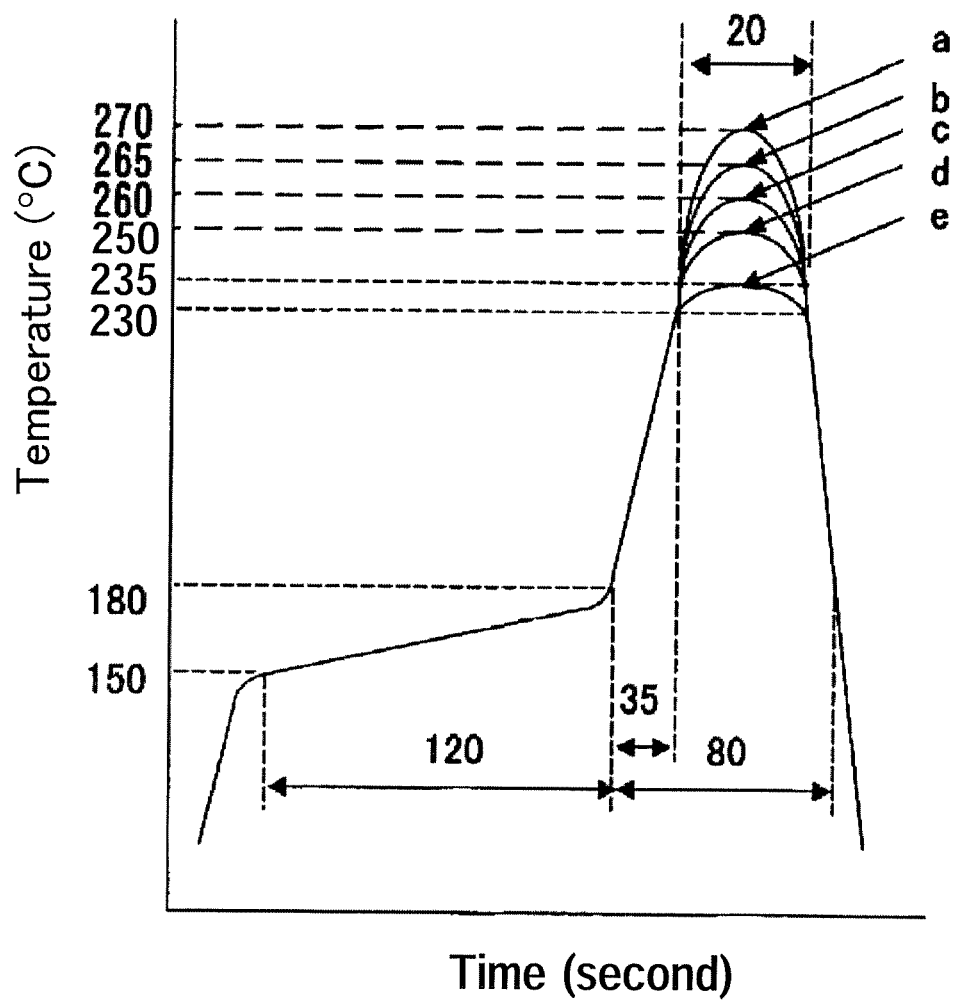

FLAME-RETARDANT POLYAMIDE COMPOSITION

TECHNICAL FIELD

The present invention relates to a flame-retardant polyamide composition.

BACKGROUND ART

As materials for electric parts, polyamide resins have been used that can be molded into desired shape by heat melting. In general, aliphatic polyamides such as Nylon 6 and Nylon 66 are used in many fields. These aliphatic polyamides generally have excellent moldability, but are insufficient in heat resistance under certain circumstances. Thus, for example, it may be the case that they are inappropriate as resin materials for surface-mounted components such as connectors that are exposed to high temperatures in a reflow soldering process.

On the other hand, Nylon 46, which was developed as a polyamide with high heat resistance, has the disadvantage of high water absorbency. For this reason, electric parts molded of a Nylon 46 resin composition may undergo size change due to water absorption. Moreover, when a molded article of the Nylon 46 resin composition has absorbed water and is then heated in a reflow soldering process, unwanted "blisters" occurs in the article. To avoid environmental problems, particularly in recent years, surface-mounting schemes using lead-free solders have been increasingly employed. As lead-free solders have higher melting points than conventional lead-based solders, the mounting temperature must be increased by 10-20° C. than before, making the use of Nylon 46 more and more difficult.

To overcome this problem aromatic polyamides were developed, which are the polycondensates of aromatic dicarboxylic acids (e.g., terephthalic acid) and aliphatic alkylene diamines. Aromatic polyamides have higher heat resistance and lower water absorbency than aliphatic polyamides such as Nylon 46, as well as high stiffness—a feature of polyamide resins.

However, electric parts such as connectors are becoming thinner and smaller along with the recent enhancement in the performance of cellular phones, personal computers, etc. Thus, the current challenge is to achieve higher resin fluidity upon molding and higher dimensional accuracy of a molded article (e.g., lower warpage).

To solve these problems, polyamide compositions containing a plate-shaped inorganic filler are proposed (see Patent Document 1). Plate-shaped inorganic fillers, however, significantly impair mechanical properties, particularly stiffness, of a molded article compared to glass fibers which are fibrous fillers. Accordingly, the use of such a plate-shaped inorganic filler may cause troubles in the final product. In addition, polyamide compositions containing a glass fiber having a deformed cross section are proposed (see Patent Document 2).

Patent Document 1: Japanese Patent Application Laid-Open No. 2000-212437
Patent Document 2: Japanese Patent Application Laid-Open No. 2003-82228

DISCLOSURE OF INVENTION

Problems to be Solved by the Invention

The inventor focused on the fact that a molded article has reduced warpage when the aspect ratio of a cross section of a glass fiber contained in the polyamide composition constituting the article is made large. However, it was found that increasing this aspect ratio in an attempt to further decrease warpage leads to a serious problem of poor granulation ability when producing resin pellets from a polyamide composition by means of a twin-screw extruder or the like. The inventor also found that one cause of this problem is that a glass fiber whose cross section has a large aspect ratio is less likely to be dispersed in the polyamide composition.

An object of the present invention is therefore to achieve improved polyamide composition fluidity at the time of molding; improved mechanical properties (e.g., stiffness) of the molded article; improved heat resistance and flame retardancy during a reflow soldering process; improved granulation ability of the polyamide composition upon granulation by a twin-screw extruder or the like; and reduced warpage of the molded article.

Means for Solving the Problem

In light of the foregoing situation, the inventor conducted extensive studies and completed the present invention by establishing that a flame-retardant polyamide composition that has so excellent physical properties as to be able to achieve the foregoing object can be obtained by appropriately selecting the polyamide resin, glass fiber, etc., to be contained in the polyamide composition.

That is, a first aspect of the present invention relates to flame-retardant polyamide compositions described below.

[1] A flame-retardant polyamide composition having a melting point of 280-340° C., including:
   20-80 mass % polyamide resin (A) having a repeating unit composed of a multifunctional carboxylic acid unit (a-1) and a multifunctional amine unit (a-2) having 4-25 carbon atoms, the multifunctional carboxylic acid unit (a-1) composed of 30-100 mol % terephthalic acid unit, 0-70 mol % multifunctional aromatic carboxylic acid unit other than terephthalic acid, and 0-70 mol % multifunctional aliphatic carboxylic acid unit having 4-20 carbon atoms;
   1-40 mass % flame retardant (B);
   5-60 mass % glass fiber (C); and
   0.5-5 mass % auxiliary flame retardant (D) (where total amount of (A), (B), (C) and (D) is 100 mass %), wherein
   a warpage amount after reflow is less than 2 mm, the warpage amount measured by a method including:
      preparing as a test piece an injection molding article having a length of 50 mm, width of 30 mm and thickness of 0.6 mm;
      allowing the test piece to stand at 23° C. for 24 hours;
      measuring the difference X between maximum height and minimum height of the test piece placed on a flat plate;
      passing the test piece though a reflow furnace heated to 260° C. and cooling the test piece to 23° C.;
      measuring the difference Y between maximum height and minimum height of the test piece placed on a flat plate; and
      subtracting X from Y to find the warpage amount.

[2] The flame-retardant polyamide composition according to [1], wherein the aspect ratio of a cross section of glass fiber (C) is larger than 3.

[3] flame-retardant polyamide composition according to [1] or [2], wherein flame retardant (B) is brominated polystyrene and contains 65-71 mass % bromine in the molecule thereof.

[4] The flame-retardant polyamide composition according to any one of [1] to [3], wherein flame retardant (B) is composed of two or more compounds with different melt flow rates (MFR), and contains flame retardant (B1) having a MFR of 100-1,000 g/10 min and flame retardant (B2) having a MFR of 0.05-10 g/10 min, as measured at 270° C. under a load of 1,200 g.

A second aspect of the present invention relates to a molded article and electrical part produced from the polyamide composition described below.

[5] A molded article or electrical part produced through molding the flame-retardant polyamide composition according to any one of [1] to [4].

Advantageous Effect of the Invention

The present invention provides a flame-retardant polyamide composition that shows high fluidity upon molding and excel lent granulation ability when granulated by a twin-screw extruder or the like, the flame-retardant polyamide composition showing excellent heat resistance and flame retardancy during a reflow soldering process and enabling provision of a molded article having reduced warpage. Thus, the polyamide composition and molded article of the present invention have very high industrial value.

BRIEF DESCRIPTION OF DRAWINGS

FIG. 1 shows a graph of reflow process temperature vs. reflow process time in reflow heat resistance tests conducted in Examples and Comparative Examples.

BEST MODE FOR CARRYING OUT THE INVENTION

1. Flame-Retardant Polyamide Composition

Polyamide Resin (A)

A flame-retardant polyamide composition of the present invention contains polyamide resin (A). Preferably, polyamide resin (A) is composed of a multifunctional carboxylic acid unit (a-1) and a multifunctional amine unit (a-2).

Preferably, polyamide resin (A) is crystalline, i.e., has a melting point. When the melting point (Tm) of polyamide resin (A) is defined as a temperature corresponding to an endothermic peak in a differential scanning calorimetry (DSC) curve, which is obtained by heating polyamide resin (A) at a heating rate of 10° C./min using a differential scanning calorimeter, the melting point is 280-340° C., preferably 300-340° C., more preferably 315-330° C. Particularly, compositions that contain a polyamide resin whose melting point falls within the above range have excellent heat resistance. Moreover, when the melting point of the polyamide resin is 280° C. or above, 300° C. or above, particularly within 315-330° C., sufficient heat resistance can be imparted to a molded article produced from the polyamide composition. It is thus possible to suitably employ a reflow soldering process that uses a lead-free solder having a high melting point.

When the melting point of the polyamide resin is below 350° C., e.g., when the melting point is 340° C. or below, resin molding can be carried out without causing such problems as generation of foams or decomposition gas and color changes of the molded article.

Multifunctional Carboxylic Acid Unit (a-1)

The multifunctional carboxylic acid unit (a-1) constituting polyamide resin (A) is not specifically limited. The components of the multifunctional carboxylic acid unit (a-1) are selected so that the above-noted desired melting point and heat resistance can be obtained. By way of example, a preferred multifunctional carboxylic acid unit (a-1) contains 30-100 mol % terephtalic acid unit, 0-70 mol % multifunctional aromatic carboxylic acid unit other than terephtalic acid, and 0-70 mol % multifunctional aliphatic carboxylic acid unit having 4-20 carbon atoms, based on the total amount of the multifunctional carboxylic acid units.

Examples of the carboxylic acid constituting the multifunctional aromatic carboxylic acid unit other than terephthalic acid include isophthalic acid, 2-methyl terephthalic acid, naphthalene dicarboxylic acid, phthalic anhydride, trimellitic acid, pyromellitic acid, trimellitic anhydride, and pyromellitic anhydride, with isophthalic acid being particularly preferable. These carboxylic acids may be used alone or in combination.

The multifunctional aromatic carboxylic acid unit may contain an aromatic carboxylic acid unit having three or more functional groups; however the contained amount is adjusted so as to avoid gellation of resin. More specifically, it needs to be contained in an amount of not greater than 10 mol % based on the amount of the multifunctional carboxylic acid unit (a-1).

The carboxylic acid constituting the multifunctional aliphatic carboxylic acid unit is a multifunctional aliphatic carboxylic acid having 4-20 carbon atoms, preferably 4-12 carbon atoms, more preferably 4-8 carbon atoms. Examples of the carboxylic acid constituting the multifunctional aliphatic carboxylic acid unit include adipic acid, suberic acid, azelaic acid, sebacic acid, decanedicarboxylic acid, undecanedicarboxylic acid, and dodecanedicarboxylic acid. Among them, adipic acid is particularly preferable in view of improving the mechanical properties.

Where necessary, the multifunctional aliphatic carboxylic acid unit may further contain an aliphatic carboxylic acid having three or more carboxylic groups; however, the contained amount should be adjusted so as to avoid gellation of resin. More specifically, it needs to be contained in an amount of not greater than 10 mol % based on the amount of the multifunctional carboxylic acid unit (a-1).

The amount of the terephthalic acid unit is 30-100 mol %, preferably 50-70 mol %, more preferably 60-70 mol %, based on the amount of the multifunctional carboxylic acid unit (a-1) of polyamide resin (A).

The amount of the multifunctional aromatic carboxylic acid unit other than terephthalic acid is 0-70 mol %, preferably 0-25 mol %, more preferably 0-10 mol %, based on the amount of the multifunctional carboxylic acid unit (a-1) of polyamide resin (A). When the amount of the multifunctional aromatic carboxylic acid unit is large, moisture absorption decreases and reflow heat resistance tends to increase. The amount of the terephthalic acid unit is preferably 60 mol % or more particularly where a reflow soldering process using lead-free solders is employed. The crystallinity of the polyamide resin increases as the amount of the multifunctional aromatic carboxylic acid unit decreases. Thus, the resultant molded article tends to have excellent mechanical properties, particularly stiffness.

The amount of the multifunctional aliphatic carboxylic acid unit having 4-20 carbon atoms is 0-70 mol %, preferably 30-50 mol %, more preferably 30-40 mol %, based on the amount of the multifunctional carboxylic acid unit (a-1) of polyamide resin (A).

Multifunctional Amine Unit (a-2)

The multifunctional amine unit (a-2) constituting polyamide resin (A) may be a multifunctional amine unit having 4-25 carbon atoms, preferably 4-12 carbon atoms, or more preferably a linear multifunctional amine unit having 4-8 carbon atoms. The multifunctional amine unit (a-2) may be either linear or cyclic, or may have a side chain. Moreover, the multifunctional amine unit (a-2) may be either aliphatic or aromatic, but is preferably aliphatic.

Specific examples of the amine constituting a linear multifunctional amine unit include 1,4-diaminobutane, 1,6-diaminohexane, 1,7-diaminoheptane, 1,8-diaminooctaone, 1,9-diaminononane, 1,10-diaminodecane, 1,11-diaminoundecane, and 1,12-diaminododecane. Among them, 1,9-diaminononane and 1,6-diaminohexane are preferable, with 1,6-diaminohexane being more preferable. When the repeating unit of polyamide resin (A) contains 1,6-diaminohexane, the resultant molded article shows low warpage.

Examples of the amine constituting a multifunctional aliphatic amine unit having a side chain include 2-methyl-1,5-diaminopentane, 2-methyl-1,6-diaminohexane, 2-methyl-1,7-diaminoheptane, 2-methyl-1,8-diaminooctane, 2-methyl-1,9-diaminononane, 2-methyl-1,10-diaminodecane, and 2-methyl-1,11-diaminoundecane.

Examples of the amine constituting a multifunctional alicyclic amine unit include alicyclic diamines such as 1,3-diaminocyclohexane, 1,4-diaminocyclohexane, 1,3-bis(aminomethyl)cyclohexane, 1,4-bis(aminomethyl)cyclohexane, isophoronediamine, piperazine, 2,5-dimethylpiperazine, bis(4-aminocyclohexyl)methane, bis(4-aminocyclohexyl)propane, 4,4'-diamino-3,3'-dimethyldicyclohexylpropane, 4,4'-diamino-3,3'-dimethyldicyclohexylmethane, 4,4'-diamino-3,3'-dimethyl-5,5'-dimethyldicyclohexyl methane, 4,4'-diamino-3,3'-dimethyl-5,5'-dimethyldicyclohexyl propane, α,α'-bis(4-aminocyclohexyl)-p-diisopropylbenzene, α,α'-bis(4-aminocyclohexyl)-m-diisopropylbenzene, α,α'-bis(4-aminocyclohexyl)-1,4-cyclohexane, and α,α'-bis(4-aminocyclohexyl)-1,3-cyclohexane.

The multifunctional amine unit (a-2) constituting polyamide resin (A) may contain an amine unit having three or more functional groups; however, the contained amount should be adjusted so as to avoid gellation of resin. More specifically, it needs to be contained in an amount of not greater than 10 mol % based on the amount of the multifunctional amine unit (a-2).

Production of Polyamide Resin(A)

Polyamide resin (A) can be produced by any known method. It can be generally produced by adding in a reaction system a multifunctional carboxylic acid constituting the multifunctional carboxylic acid unit (a-1) and a multifunctional amine constituting the multifunctional amine unit (a-2) and, by heating the system in the presence of catalyst. Preferably, the total mole number of the multifunctional amine to be added in the reaction system is greater than that of the multifunctional carboxylic acid. Most preferably, the total amount of the multifunctional amine is 100-120 mole equivalents per 100 mole equivalents of the total multifunctional carboxylic acids to be added in the reaction system.

This reaction is generally performed under an inert gas atmosphere; in general, the reaction vessel is purged with inert gas such as nitrogen gas. Preferably, water is previously added in the vessel to control the polycondensation reaction of polyamides. This water may additionally contain a water-soluble organic solvent, e.g., alcohol such as methanol or ethanol.

Examples of the catalyst used for polycondensation reactions for producing polyamide resin (A) include phosphoric acid and salts and esters thereof; phosphorous acid and salts and esters thereof; and hypophosphorous acid and salts and esters thereof. Among them, sodium phosphate, sodium phosphite, potassium hypophosphite, sodium hypophosphite, etc. are preferable. These phosphate compounds can be used alone or in combination. The use amount of the catalyst is generally 0.01-5 moles, more preferably 0.05-2 moles, per 100 moles of the multifunctional carboxylic acid.

It is preferable to use an end-capping agent upon production of polyamide resin (A). The end-capping agent reacts with the ends of a polycondensate, capping the ends and preventing further polycondensation reactions. Examples of the end-capping agent include benzoic acid, alkali metal salts thereof, and acetic acid. The use amount of the end-capping agent is generally 0.1-5 moles, more preferably 0.5-2 moles, per 100 moles of the multifunctional carboxylic acid. By adjusting the use amount of the end-capping agent, the intrinsic viscosity [η] of the resultant polycondensates can be adjusted.

The specific polycondensation reaction conditions for the production of the above polycondensate is as follows: The reaction temperature is generally set to 200-290° C., more preferably 220-280° C.; and the reaction time is generally set to 0.5-5 hours, preferably 1-3 hours. This reaction can be performed under any pressure condition—under normal pressure or increased pressure. However, the reaction is preferably performed under increased pressure. The reaction pressure is generally set to 2-5 MPa, preferably 2.5-4 Mpa.

This polycondensation reaction yields condensates with a low condensation degree (i.e., oligomers) that generally have an intrinsic viscosity [η] of 0.05-0.6 dl/g, more preferably 0.08-0.3 dl/g, as measured with a Ubbelohde viscometer in 96.5% sulfuric acid at 25° C. These polyamide oligomers produced in an aqueous medium are then separated from the reaction solution. The separation can be achieved for instance by filtration or centrifugation. To increase the separation efficiency, the reaction solution containing polyamide oligomers may be sprayed in the air through nozzles.

Preferably, polyamide resin (A) are produced by further polymerizing the polyamide oligomers obtained as described above. More specifically, post polymerization is performed in the following manner: After drying polyamide oligomers, they are heated and melted while imparting shearing force to the molten product. In this post polycondensation reaction, dried polyamide oligomers are kept heated at least until they are melted. The dried polyamide oligomers are generally heated to temperatures not lower than their melting points, preferably to temperatures 10-60° C. higher than the melting points. The shearing force can be applied by use of a vent-equipped twin-screw extruder or a kneader. It is considered that application of shearing force causes not only polycondensation of dried molten polyamide oligomers, but polycondensation between polycondensates or between dried polyamide oligomers and polycondensates.

Polyamide resin (A) may be produced by solid-phase polymerization of the polyamide oligomers. That is, polyamide oligomers are polymerized by a known solid-phase polymerization method to produce a polyamide that has an intrinsic viscosity [η] of 0.5-1.2 dl/g as measured in the manner described above.

Alternatively, polyamide resin (A) may be produced by melt polymerization of the solid-phase polymerized polyamide oligomers obtained as described above. That is, after solid-phase polymerization of polyamide oligomers has been performed using a known method, melt polymerization is further performed to produce a polyamide that has an intrinsic viscosity [η] of 0.5-1.2 dl/g as measured in the manner described above.

The intrinsic viscosity [η] of polyamide resin (A), as measured in 96.5% sulfuric acid at 25° C., is generally 0.5-1.2 dl/g, preferably 0.5-0.9 dl/g, more preferably 0.7-0.85 dl/g. When the intrinsic viscosity falls within these ranges, a polyamide composition having excellent fluidity and a molded article having high stiffness can be obtained. The dispersibility of a flame retardant contained in the polyamide composition obtained by melt-kneading increases with decreasing intrinsic viscosity [η] of the polyamide resin within the above ranges. Therefore, the molded article tends to have high stiffness as well as high flame retardancy.

The polyamide resin (A) content in the flame-retardant polyamide composition of the present invention is 20-80 mass %, preferably 30-60 mass %, more preferably 30-50 mass %, based on the total amount of polyamide resin (A), flame retardant (B), glass fiber (C) and auxiliary flame retardant (D). When the polyamide resin (A) content is 20 mass % or more, it is possible to produce a molded article having sufficient stiffness. Moreover, when the polyamide resin (A) content is 80 mass % or less, sufficient amounts of flame retardant and auxiliary flame retardant can be added, making it possible to produce a molded article having high flame retardancy.

(B) Flame Retardant

Flame retardant (B) contained in the flame-retardant polyamide composition of the present invention may be added in order to reduce the resin flammability. Although polyamide resins are self-extinguishing in nature, they are preferably formulated into flame retardant-containing resin compositions as needed when intended for use as electric parts or surface-mounted components that often require high flame retardancy or heat resistance sufficient to meet the Underwriters Laboratories (UL) 94 V-0 requirements.

There are no specific limitations on flame retardant (B) and any known flame retardant can be employed. Examples of flame retardant (B) include halogen compounds, phosphoric salt compounds, phosphoric ester compounds, silicone compounds, and nitrogenous compounds. Flame retardant (B) is preferably selected from brominated polystyrene, polybrominated styrene, brominated polyphenyleneether, metal salts of phosphate compounds, phosphazene compounds, and melamine polyphosphate. This is because these compounds can provide high flame retardancy and high mechanical properties even when added in a small amount. Among them, brominated polystyrene, polybrominated styrene, and aluminum salts of phosphate compounds are preferable, with brominated polystyrene being more preferable.

Brominated polystyrene, which serves as flame retardant (B), is a bromide of polystyrene or poly-α-methylstyrene. In the brominated polystyrene, which is produced by polymerization of styrene or poly-α-methylstyrene followed by bromination, some of the hydrogen atoms bonded to the carbon atoms of aromatic rings are replaced by bromine atoms. With other production methods, there is a case that some hydrogen atoms bonded to the carbon atoms of the alkyl chain—main skeleton of the polymer—are also replaced by bromine atoms. It is preferable that flame retardant (B) be a brominated polystyrene in which some of the hydrogen atoms bonded to the carbon atoms of aromatic rings are replaced by bromine atom and in which hydrogen atoms bonded to the carbon atoms of the alkyl chain serving as a main skeleton of the polymer are not substantially replaced by bromine atoms. In addition, the bromine content of the brominated polystyrene (flame retardant (B)) is preferably 65-71 mass %, more preferably 67-71 mass %.

As used herein "hydrogen atoms bonded to the carbon atoms of the alkyl chain serving as a main skeleton of the polymer are not substantially replaced by bromine atoms" means that the ratio at which hydrogen atoms of the carbon atoms bonded to the main skeleton are replaced by bromine atoms is 0-0.5 mass %, and more preferably 0-0.2 mass %. Such a brominated polystyrene has high thermal stability.

Moreover, a flame-retardant polyamide composition and a molded article produced from the composition, which contain the above brominated polystyrene, also have high thermal stability.

Preferably, the brominated polystyrene used as flame retardant (B) is a combination of two or more brominated polystyrenes with different MFRs, i.e., a combination of flame retardants (B1) and (B2). The MFR is a value measured under the following condition: load=1,200 g; temperature=270° C.; orifice inner diameter=2.095 mm.

Flame retardant (B1) generally has a MFR of 100-1,000 g/10 min, preferably 300-1,000 g/10 min, more preferably 400-900 g/10 min. Meanwhile, flame retardant (B2) generally has an MFR of 0.05-10 g/10 min, preferably 0.05-5 g/10 min, more preferably 0.05-1 g/10 min.

The mass ratio of flame retardant (B1) to flame retardant (B2) is generally 95/5-30/70, preferably 95/5-40/60, more preferably 90/10-50/50. When flame retardant (B2) is added in an amount of 5 parts by mass or more per 95 parts by mass of flame retardant (B1), the granulation ability of the composition with a twin-screw extruder or the like increases. Moreover, when flame retardant (B2) is added in an amount of 70 parts by mass or less per 30 parts by mass of flame retardant (B1), there is no reduction in the fluidity of the composition upon resin molding.

When the aspect ratio of a cross section of glass fiber (C) to be described later is made large (e.g., 3 or greater), it may be that the glass fiber is not uniformly dispersed in the composition. However, the inventor found that the combined use of flame retardant (B1) having large a MFR and flame retardant (B2) having a small MFR made it easy even for such a high-aspect ratio glass fiber to be dispersed in the composition.

The flame retardant (B) content of the flame-retardant polyamide composition of the present invention may be set to 0 mass % based on the total amount of polyamide resin (A), flame retardant (B), glass fiber (C) and auxiliary flame retardant (D); however, it is generally 1-40 mass %, preferably 5-30 mass %, more preferably 12-25 mass %. Addition of flame retardant (B) can impart higher levels of flame retardancy to the flame-retardant polyamide composition or a molded article thereof. Moreover, when the flame retardant (B) content is 40 mass % or less, there is no reduction in the stiffness of the molded article.

(C) Glass Fiber

Glass fiber (C) contained in the flame-retardant polyamide composition of the present invention imparts strength, rigidity, and stiffness to the resultant molded article. Moreover, it reduces warpage of the molded article. In order to achieve further warpage suppression, the aspect ratio of a cross section of glass fiber (C) is preferably made larger than 3.

The aspect ratio of a cross section means the ratio of the major axis to the minor axis of a cross section of a glass fiber. The cross sectional shape of the glass fiber is not specifically limited; it can be cocoon shape (peanut shape), oval shape, rectangle shape, etc. The upper limit of the aspect ratio is not also specifically limited as long as it is larger than 3; however, it is generally 10 or less, preferably 8 or less, more preferably 5 or less. When the aspect ratio is larger than 3, warpage suppression effects are exerted. Moreover, when the aspect ratio is 10 or less, it results in increased granulation stability of the polyamide composition with a twin-screw extruder or the like.

The aspect ratio of a cross section of the glass fiber can be measured as follows: The glass fiber is isolated by dissolution of resin components using a solvent or by firing the glass fiber-containing composition or molded article. The isolated glass fiber is then measured for its major axis and minor axis lengths using an optical microscope or electron microscope to calculate the aspect ratio.

The length of the minor axis of a cross section of the glass fiber (C) is generally 3-15 μm, preferably 5-12 μm, more preferably 5-9 μm. Sufficient mechanical properties can be imparted to the molded article when the minor axis length is 15 μm or less. The average length of glass fiber (C) is generally 0.1-20 mm, preferably 0.3-6 mm. Sufficient mechanical properties can be imparted to the molded article when the average fiber length is 0.1 mm or more.

Glass fiber (C) may be treated with a silane coupling agent or titanium coupling agent. For example, glass fiber (C) may be surface-treated with a silane compound such as vinylethoxysilane, 2-aminopropyltriethoxysilane, or 2-glycidoxypropyltriethoxysilane.

A binder may be applied to glass fiber (C). Preferable examples of the binder include acrylic compounds, acryl/maleic acid-modified compounds, epoxy compounds, urethane compounds, urethane/maleic acid-modified compounds, and urethane/epoxy-modified compounds. These binders may be used alone or in combination.

Moreover, the surface treating agent may be used in combination with the binder. This increases adhesion between a fibrous filler and other components in the polyamide composition of the present invention, improving appearance and strength characteristics.

The glass fiber (C) content of the flame-retardant polyamide composition of the present invention is generally 5-60 mass %, preferably 10-50 mass %, more preferably 20-50 mass %, based on the total amount of polyamide resin (A), flame retardant (B), glass fiber (C) and auxiliary flame retardant (D). Addition of glass fiber can impart rigidity to the resultant molded article.

Moreover, when the glass fiber (C) content of the flame-retardant polyamide composition is 5 mass % or more, a minimum level of rigidity can be obtained and minimum required warpage suppression can be achieved, depending on the intended shape of the molded article. When the glass fiber (C) content of the flame-retardant polyamide composition is 60 mass % or less, there are no reductions in the fluidity at the time of molding and in the granulation stability of the polyamide composition with a twin-screw extruder or the like.

Preferably, glass fiber (C) is uniformly dispersed in the flame-retardant polyamide composition, as well as in the resultant molded article. When glass fiber (C) is uniformed dispersed, it increases granulation ability and improves mechanical properties of the molded article.

Auxiliary Flame Retardant (D)

It is only necessary for auxiliary flame retardant (D) to increase the flame retardancy of flame retardant (B) when used in combination in the flame-retardant polyamide composition of the present invention. Any known auxiliary flame retardant can be employed. Specific examples of auxiliary flame retardant (D) include antimony compounds such as antimony trioxide, antimony tetroxide, antimony pentoxide and sodium antimonate; zinc compounds such as zinc borate, zinc stannate and zinc phosphate; calcium borate; and calcium molybdate. These compounds can be used alone or in combination. Among them, sodium antimonate, zinc borate and zinc phosphate are preferable, with anhydrous zinc borate ($2ZnO.3B_2O_3$) being more preferable.

The auxiliary flame retardant (D) content of the flame-retardant polyamide composition of the present invention may be set to 0 mass % based on the total amount of polyamide resin (A), flame retardant (B), glass fiber (C) and auxiliary flame retardant (D); however, it is generally 0.5-5 mass %, preferably 1-4 mass %, more preferably 1-3.5 mass %.

Moreover, auxiliary flame retardant (D) is preferably a combination of sodium antimonate (D1) and anhydrous zinc borate ($2ZnO.3B_2O_3$) (D2). If combined, the UL 94-V0 requirements may be met by the addition of small amount of flame retardant (B). When auxiliary flame retardant (D) is the combination of sodium antimonate (D1) and anhydrous zinc borate (D2), the mass ratio (D1/D2) is generally 100/0-1/99, preferably 30/70-1/99, more preferably 20/80-1/99.

When auxiliary flame retardant (D) is the combination of sodium antimonate (D1) and anhydrous zinc borate (D2), the total amount of sodium antimonate (D1) and anhydrous zinc borate (D2) in the flame-retardant polyamide composition of the present invention is generally 0-5 mass %, preferably 1-4 mass %, more preferably 1-3.5 mass %, based on the total amount of polyamide resin (A), flame retardant (B), glass fiber (C) and auxiliary flame retardant (D).

The sodium antimonate (D1) content of the flame-retardant polyamide composition of the present invention is generally 0-3 mass %, preferably 0.1-2 mass %, more preferably 0.2-0.4 mass %, based on the total amount of polyamide resin (A), flame retardant (B), glass fiber (C) and auxiliary flame retardant (D). The anhydrous zinc borate (D2) content of the flame-retardant polyamide composition of the present invention is generally 0-10 mass %, preferably 0-3 mass %, more preferably 1-3 mass %, based on the total amount of polyamide resin (A), flame retardant (B), glass fiber (C) and auxiliary flame retardant (D).

Additional Additives

In addition to the above components, the flame-retardant polyamide composition of the present invention may optionally contain known additives as long as the effect of the present invention is not impaired. Examples of such known additives include heat stabilizers (e.g., phenol-based, phosphorus-based, and amine-based heat stabilizers), weathering stabilizers (e.g., HALS and UVA), fluidity improvers, plasticizers, thickeners, antistatic agents, releasing agents, pigments, dyes, inorganic or organic fillers, nucleating agents, whiskers, fiber stiffeners, carbon black, talc, clay, mica, and glass flake. In particular, when a fiber stiffener is added in the flame-retardant polyamide composition of the present invention, it further increases heat resistance, flame retardancy, rigidity, tension strength, bending strength, impact strength, etc, of the molded article.

The flame-retardant polyamide composition of the present invention may also contain a general-purpose halogen scavenger such as hydrotalcite.

The flame-retardant polyamide composition of the present invention may contain additional polymers as long as the effect of the present invention is not impaired. Examples of such polymers include polyolefins such as polyethylene, polypropylene, poly(4-methyl-1-pentene), ethylene/1-butene copolymers, propylene/ethylene copolymers and polyolefin elastomers, polystyrene, polyamide, polycarbonate, polyacetal, polysulfone, polyphenylene oxide, fluorine resins, silicone resins, PPS, LCP, and Teflon®. Other examples are modified polyolefins. Examples thereof include polyethylenes modified by carboxyl group, acid anhydride group, or amide group, etc; modified aromatic vinyl compound/conjugated diene copolymers such as modified SEES or hydrides thereof; and modified polyolefin elastomers such as modified ethylene/propylene copolymers.

Preparation Method for Flame-Retardant Polyamide Composition

The flame-retardant polyamide composition of the present invention may be produced by a known resin kneading method. For example, it is possible to employ a method in which raw materials are mixed using Henschel mixer, V-blender, Ribbon blender or tumble blender; or a method in which the mixture is further melt-kneaded using a single-screw extruder, multi-screw extruder, kneader or banbury mixer and then the kneaded product is granulated or pulverized.

2. Molded Article

The molded article of the present invention can be obtained by molding the flame-retardant polyamide composition of the present invention. The molding method is not specifically limited, and the flame-retardant polyamide composition can be formed into any article by a known molding method such as compaction molding, injection molding, or extrusion molding.

The flow length of the flame-retardant polyamide composition of the present invention, measured upon injection molding of the resin into a bar-flow mold, is 40-90 mm, preferably 50-90 mm, more preferably 65-90 mm. When the flow length is 40 mm or more, it becomes easy to produce a thin molded article. The flow length is measured in accordance with the procedure described in Examples to be described later.

The breaking energy of the molded article of the present invention, which is the mechanical property indicative of stiffness, is 35-70 mJ, more preferably 40-65 mJ. When the breaking energy is 35 mJ or more, it is possible to prevent breakage upon insertion or removal of another component or breakage during other assembly processes due to external force, contributing reductions in the product size and thickness.

The reflow heat resistance temperature of the molded article of the present invention, measured after subjected to moisture absorption for 96 hours at 40° C. and relative humidity of 95%, is generally 250-280° C., preferably 250-275° C., more preferably 250-265° C. When the reflow heat resistance temperature is 250° C. or above, lead-free soldering is made possible.

The flammability rating of the molded article of the present invention in accordance with the UL 94 standard is HB, preferably V-2, more preferably V-1, further preferably V-0.

As to the warpage of a plate-shaped molded article of the present invention, the total amount of warpage measured after molding and that measured after reflow is generally 0-5 mm, preferably 0-3 mm, more preferably 0-2 mm. In the case of a thin, plate-shaped molded article for use as a card connector or the like, deformation due to warpage can be prevented when the total warpage amount is 5 mm or less. The warpage amount after molding and warpage amount after reflow are measured in accordance with the procedure described in Examples to be described below.

Because the molded article of the present invention has high stiffness, heat resistance and flame retardancy and shows low warpage, which are characteristics required for surface-mounting using lead-free solders, it is particularly used for electric parts. More specifically, the molded article of the present invention is applicable as electric parts such as automobile electrical components, circuit breakers, connectors and LED reflection materials, and as molded articles such as coil bobbins and housings.

EXAMPLES

Hereinafter, the present invention will be detailed with reference to Examples, which however shall not be construed as limiting the scope of the present invention.

Physical properties of polyamide resins, polyamide compositions and molded articles prepared in Examples and Comparative Examples were measured and evaluated as described below.

[Intrinsic Viscosity [$\eta$]]

Intrinsic viscosity was measured in accordance with JIS K6810-1977. Sample solution was prepared by dissolving 0.5 g of polyamide resin in 50 ml of 96.5% sulfuric acid solution. The flow-down time of the sample solution was measured using a Ubbelohde viscometer at 25±0.05° C. Intrinsic viscosity [$\eta$] was then calculated using the following equation.

$$[\eta] = \eta SP/[C(1+0.205\eta SP)]$$

$$\eta SP = (t-t0)/t0$$

[$\eta$]: intrinsic viscosity (dl/g)
$\eta SP$: specific viscosity
C: sample concentration (g/dl)
t: sample flow-down time (sec)
t0: flow-down time (sec) of sulfuric acid (blank)

[Melting Point (Tm)]

The melting point of the polyamide resin was measured using DSC-7 (PerkinElmer, Inc.). The polyamide resin was held at 330° C. for 5 minutes, cooled to 23° at a rate of 10° C./min, and then heated at a heating rate of 10° C./min. The endothermic peak based on the melting of the polyamide resin was employed as the melting point.

[Flow Length Test (Fluidity)]

The polyamide composition was injected under the following condition using a bar-flow mold (width: 10 mm, thickness: 0.5 mm) to measure its flow length (mm) in the mold.

Injection molding machine: TUPARL TR40S3A (Sodick Plustech Co., Ltd.)

Injection pressure: 2,000 kg/cm$^2$

Cylinder set temperature: polyamide resin melting point (Tm) plus 10° C.

Mold temperature: 120° C.

[Bending Test (Stiffness)]

A test piece (length: 64 mm, width: 6 mm, thickness: 0.8 mm) was prepared by injection molding. The used molding machine, cylinder temperature, and mold temperature are shown below.

Molding machine: TUPARL TR40S3A (Sodick Plustech Co., Ltd.)

Cylinder temperature: polyamide resin melting point (Tm) plus 10° C.

Mold temperature: 120° C.

The prepared test piece was allowed to stand in nitrogen gas atmosphere at 23° C. for 24 hours. Using a bending tester (AB5, manufactured by NTESCO), a bending test was performed at 23° C. and relative humidity of 50% under the following conditions: span=26 m, bending rate=5 mm/min. In this way the bending strength, deformation amount, elasticity, and energy required for breaking the test piece (stiffness) were measured.

[Reflow Heat Resistance Test]

A test piece (length: 64 mm, width: 6 mm, thickness: 0.8 mm) was prepared by injection molding. The used molding machine, cylinder temperature, and mold temperature are shown below.

Molding machine: TUPARL TR40S3A (Sodick Plustech Co., Ltd.)

Cylinder temperature: polyamide resin melting point (Tm) plus 10° C.

Mold temperature: 120° C.

The test piece was humidity-conditioned at 40° C. and a relative humidity of 95% for 96 hours. The test piece was placed on a 1 mm-thick glass epoxy substrate. A temperature sensor was placed on the substrate to measure a temperature profile. A reflow soldering process was performed in accordance with the temperature profile using an air reflow soldering machine (AIS-20-82-C, manufactured by EIGHTECH TECTRON CO., LTD.) Referring to FIG. 1, the test piece was heated to 235° C. at a predetermined heating rate, heated to a predetermined set temperature ("a": 270° C., "b": 265° C., "c": 260° C., "d": 250° C., or "e": 235° C.) over 20 seconds, and cooled back to 230° C.

From the above reflow process the highest set temperature was found at which the test piece was not molten and no blister was observed on its surface. This highest set temperature was defined as a reflow heat resistance temperature. In general, test pieces subjected to moisture absorption tend to have lower reflow heat resistance temperatures than completely-dried test pieces.

[Flammability Test]

A test piece (thickness: 1/32 inch, width: 1/2 inch, length: 5 inch) was prepared by injection molding. The used molding machine, cylinder temperature, and mold temperature are shown below.

Molding machine: TUPARL TR40S3A (Sodick Plustech Co., Ltd.)

Cylinder temperature: polyamide resin melting point (Tm) plus 10° C.

Mold temperature: 120° C.

A vertical combustion test was performed on the prepared test piece to evaluate flame retardancy in accordance with the UL94 standard (UL Test No. UL94, Jun. 18, 1991).

[Warpage Test]

A test piece (length: 50 mm, width: 30 mm, thickness: 0.6 mm) was prepared by injection molding. The preparation conditions are shown below.

Injection molding machine: ALLROUNDER 270S (Arburg)

Cylinder temperature: polyamide resin melting point (Tm) plus 10° C.

Mold temperature: 120° C.

Gate position: test piece center in width direction

Gate size: 2 mm in width

Injection rate: 30 cc/s

Injection pressure: 2,500 bar (max)

Pressure holding force: 300 bar

Pressure holding time: 1 s

Cooling time: 15 s

The prepared test piece was allowed to stand at 23° C. for 24 hours, and placed on a flat plate. The difference between maximum height and minimum height of the test piece on the plate was defined as "warpage amount after molding." Using the same tester as in the reflow heat resistance test above, the test piece was passed through a reflow furnace (peak temperature: 260° C.) and cooled to 23° C. The difference between the warpage amount after cooling and warpage amount after molding was defined as "warpage amount after reflow."

[Granulation Ability]

Raw materials were melt-kneaded in a twin-screw extruder (TEX30α, manufactured by The Japan Steel Works, Ltd.) at a cylinder temperature of 320° C. and extruded in strands. The strands were cooled in a water bath and cut by a pelletizer to produce pellets of polyamide composition. Granulation ability was evaluated based on the state of the kneaded product at the vent of the extruder, occurrence of strand cut, and the cut surface state of the pellets.

[Evaluation Criteria]

Successful granulation without no problem: ⊚

Small problem; less influence on granulation ability: ○

Moderate problem; some influence on granulation ability: Δ

Severe problem; granulation was disturbed: x

Polyamide resins (A) used in Examples and Comparative Examples are shown below.

[Polyamide Resin (A-1)]

Composition: Multifunctional carboxylic acid unit (terephthalic acid: 62.5 mol % and adipic acid: 37.5 mol %)

Diamine unit (1,6-diaminohexane: 100 mol %)

Intrinsic viscosity [η]: 0.8 dl/g

Melting point: 320° C.

[Polyamide Resin (A-2)]

Composition: Multifunctional carboxylic acid unit (terephthalic acid: 62.5 mol % and adipic acid: 37.5 mol %)

Diamine unit (1,6-diaminohexane: 100 mol %)

Intrinsic viscosity [η]: 1.0 dl/g

Melting point: 320° C.

[Polyamide Resin (A-3)]

Composition: Multifunctional carboxylic acid unit (terephthalic acid: 55 mol % and adipic acid: 45 mol %)

Diamine unit (1,6-diaminohexane: 100 mol %)

Intrinsic viscosity [η]: 0.8 dl/g

Melting point: 310° C.

Flame retardants (B) used in Examples and Comparative Examples are shown below. Flame retardants (B) were measured for their MFR using an automatic extrusion plastometer under the following condition: orifice inner diameter=2.095 mm, load=1,200 g, temperature=270° C.

[Flame Retardant (B1)]

Brominated polystyrene: HP-3010 (Albemarle Corporation)

Bromine content: 68 mass %

MFR: 510 g/10 min (temperature=270° C., load=1,200 g)

[Flame Retardant (B2)]

Brominated polystyrene: HP-7010 (Albemarle Corporation)

Bromine content: 68 mass %

MFR: 0.34 g/10 min (temperature=270° C., load=1,200 g)

Glass fibers (C) used in Examples and Comparative Examples are shown below.

(C1)/CSG-3PA 820 (Nitto Boseki Co., Ltd.), cross section: oval shape, aspect ratio=4

(C2)/CSH-3PA 870 (Nitto Boseki Co., Ltd.), cross section: cocoon shape, aspect ratio=2

(C3)/ECS03-615 (Central Glass Co., Ltd.), cross section: circular shape, aspect ratio=1

Auxiliary flame retardants (D) used in Examples and Comparative Examples are shown below.

(D1)/sodium antimonate (SA-A, Nihon Seiko Co., Ltd.)

(D2)/zinc borate (FIREBRAKE 500, BORAX)

In addition to the above, the following components were used in Examples and Comparative Examples.

1) maleated SEBS (Tuftec M1913, Asahi Chemicals Co., Ltd.), a drip retardant for preventing dripping of liquid resin melted by firing.

2) hydrotalcite (NAOX-33, Toda Kogyo Corporation).
3) wax (Hos-tamont CAV102, Clariant (Japan) K.K.)
4) talc (Hifiller #100 (whiteness 95), Matsumura Sangyo K.K.)

The above maleated SEBS, hydrotalcite, wax and talc were formulated in amounts of 1.4 mass %, 0.2 mass %, 0.3 mass % and 0.7 mass %, respectively, based on the total amount of polyamide resin (A), flame retardant (B), glass fiber (C), auxiliary flame retardant (D), maleated SEBS, hydrotalcite, wax and talc.

In Comparative Example 4, a commercially available flame retardant polyamide (PA9T) composition (Genestar GW2458HF, Kuraray Corporation; glass fiber content=45%, cross section's aspect ratio=2) was evaluated as a control product. This product is believed to have high fluidity and reflow heat resistance and show low warpage.

Examples 1-9 and Comparative Examples 1-4

Flame-retardant polyamide compositions were obtained by mixing the above components in amounts shown in Table 1. They were loaded in a twin-screw extruder equipped with a vent, which is set to 320° C., and melt-kneaded to produce respective pellets. Evaluations of their physical properties are shown in Table 1.

TABLE 1

| | | | Examples | | | | | | |
|---|---|---|---|---|---|---|---|---|---|
| | | unit | 1 | 2 | 3 | 4 | 5 | 6 | 7 |
| Polyamide resin (A) | (A1) | mass % | 43.1 | 43.1 | | | 43.1 | 33.8 | 43.1 |
| | (A2) | mass % | | | 43.1 | | | | |
| | (A3) | mass % | | | | 43.1 | | | |
| Flame retardant (B) | (B1) | mass % | 18.2 | 15 | 15 | 15 | 11.8 | 9.2 | 11.8 |
| | (B2) | mass % | 3.2 | 6.4 | 6.4 | 6.4 | 9.6 | 7.6 | 9.6 |
| | B1/B2 ratio | — | 85/15 | 70/30 | 70/30 | 70/30 | 55/45 | 55/45 | 40/60 |
| Glass fiber (C) | (C1) | mass % | 30 | 30 | 30 | 30 | 30 | 45 | 30 |
| | (C2) | mass % | — | — | — | — | — | — | — |
| | (C3) | mass % | — | — | — | — | — | — | — |
| Auxiliary flame retardant (D) | (D1) | mass % | 0.37 | 0.37 | 0.37 | 0.37 | 0.37 | 0.29 | 0.37 |
| | (D2) | mass % | 2.63 | 2.63 | 2.63 | 2.63 | 2.63 | 2.07 | 2.63 |
| | D1/D2 ratio | — | 12/88 | 12/88 | 12/88 | 12/88 | 12/88 | 12/88 | 12/88 |
| Fluidity | bar flow length | mm | 80 | 71 | 60 | 71 | 65 | 45 | 58 |
| Stiffness | breaking energy | mJ | 54 | 54 | 52 | 54 | 54 | 42 | 54 |
| Reflow heat resistance | | ° C. | 255 | 255 | 255 | 245 | 255 | 255 | 255 |
| Flammability test | UL94 standard | — | V-0 | V-0 | V-0 | V-0 | V-0 | V-0 | V-0 |
| Warpage amount | after molding | mm | 0.5 | 0.5 | 0.5 | 0.5 | 0.5 | 0.5 | 0.5 |
| | after reflow | mm | 0.5 | 0.5 | 0.5 | 0.5 | 0.5 | 0.5 | 0.5 |
| | total | mm | 1 | 1 | 1 | 1 | 1 | 1 | 1 |
| Granulation ability | | — | ○ | ◎ | ◎ | ◎ | ◎ | ○ | ◎ |

| | | | Examples | | Comparative Examples | | | |
|---|---|---|---|---|---|---|---|---|
| | | | 8 | 9 | 1 | 2 | 3 | 4 |
| Polyamide resin (A) | (A1) | | 43.1 | 33.8 | 43.1 | 33.8 | 43.1 | GW2458HF |
| | (A2) | | | | | | | |
| | (A3) | | | | | | | |
| Flame retardant (B) | (B1) | | 21.4 | 16.8 | 21.4 | 16.8 | 21.4 | |
| | (B2) | | — | — | — | — | — | |
| | B1/B2 ratio | | 100/0 | 100/0 | 100/0 | 100/0 | 100/0 | |
| Glass fiber (C) | (C1) | | 30 | 45 | — | — | — | |
| | (C2) | | — | — | 30 | 45 | — | |
| | (C3) | | — | — | — | — | 30 | |
| Auxiliary flame retardant (D) | (D1) | | 0.37 | 0.29 | 0.37 | 0.29 | 0.37 | |
| | (D2) | | 2.63 | 2.07 | 2.63 | 2.07 | 2.63 | |
| | D1/D2 ratio | | 12/88 | 12/88 | 12/88 | 12/88 | 12/88 | |
| Fluidity | bar flow length | | 84 | 64 | 79 | 57 | 69 | 58 |
| Stiffness | breaking energy | | 54 | 43 | 53 | 42 | 50 | 31 |
| Reflow heat resistance | | | 255 | 255 | 255 | 255 | 260 | 265 |
| Flammability test | UL94 standard | | V-0 | V-0 | V-0 | V-0 | V-0 | |
| Warpage amount | after molding | | 0.5 | 0.5 | 2 | 1 | 7 | 3 |
| | after reflow | | 0.5 | 0.5 | 2 | 2 | 2 | 3 |
| | total | | 1 | 1 | 4 | 3 | 9 | 6 |
| Granulation ability | | | Δ | X | ○ | X | ◎ | — |

While warpage amounts, both after molding and after reflow, were suppressed to 0.5 mm in Examples 1-9, large warpage amounts were produced in Comparative Examples 1-3. This is considered to be due to the fact that the cross section's aspect ratios of the glass fibers contained in the compositions in Examples 1-9 are larger than those of glass fibers contained in the compositions of Comparative Examples 1-3.

While Examples 1-7 showed excellent granulation ability, Examples 8 and 9 showed relatively low granulation ability. This is considered to be due to insufficient dispersion of glass fibers in the composition. In Examples 1-7, by contrast, glass fibers were uniformly dispersed in the composition because flame retardants with different MFRs were properly combined.

The present application claims the priority of Japanese Patent Application No. 2006-312576 filed on Nov. 20, 2006, the entire contents of which are herein incorporated by reference.

INDUSTRIAL APPLICABILITY

The flame-retardant polyamide composition of the present invention shows high fluidity upon molding, and particularly shows excellent granulation ability upon granulation using a twin-screw extruder or the like. Moreover, the molded article produced from the composition has excellent mechanical properties (e.g., stiffness) and high heat resistance and flame retardancy during a reflow soldering process, and shows low warpage.

Thus, the flame-retardant polyamide composition of the present invention is suitably used as a resin composition for electrical parts that are assembled by surface mounting using high-melting point solders like lead-free solders or for parts in the field of precise molding, particularly as a resin composition for thin, plate-shaped molded articles such as card connectors.

The invention claimed is:

1. A flame-retardant polyamide composition having a melting point of 280-340° C., comprising:
    20-80 mass % polyamide resin (A) having a repeating unit composed of a multifunctional carboxylic acid unit (a-1) and a multifunctional amine unit (a-2) having 4-25 carbon atoms, the multifunctional carboxylic acid unit (a-1) composed of 30-100 mol % terephthalic acid unit, 0-70 mol % multifunctional aromatic carboxylic acid unit other than terephthalic acid, and 0-70 mol % multifunctional aliphatic carboxylic acid unit having 4-20 carbon atoms;
    1-40 mass % flame retardant (B) composed of two or more compounds with different melt flow rates (MFR), and containing flame retardant (B1) having a MFR of 300-1,000 g/10 min and flame retardant (B2) having a MFR of 0.05-10 g/10 min, as measured at 270° C. under a load of 1,200 g;
    5-60 mass % glass fiber (C), an aspect ratio of a cross section of which being larger than 3 and 10 or less; and
    0.5-5 mass % auxiliary flame retardant (D) (where total amount of (A), (B), (C) and (D) is 100 mass %), wherein
    a warpage amount after reflow is less than 2 mm, the warpage amount measured by a method comprising:
    preparing as a test piece an injection molding article having a length of 50 mm, width of 30 mm and thickness of 0.6 mm;
    allowing the test piece to stand at 23° C. for 24 hours;
    measuring the difference X between maximum height and minimum height of the test piece placed on a flat plate;
    passing the test piece though a reflow furnace heated to 260° C. and cooling the test piece to 23° C.;
    measuring the difference Y between maximum height and minimum height of the test piece placed on a flat plate; and
    subtracting X from Y to find the warpage amount.

2. The flame-retardant polyamide composition according to claim 1, wherein the multifunctional amine unit (a-2) has 4-8 carbon atoms.

3. The flame-retardant polyamide composition according to claim 1, wherein flame retardant (B) is brominated polystyrene and contains 65-71 mass % bromine in the molecule thereof.

4. The flame-retardant polyamide composition according to claim 1, wherein auxiliary flame retardant (D) is one or more compounds selected from antimony trioxide, antimony tetroxide, antimony pentoxide, sodium antimonate, zinc borate, zinc stannate, zinc phosphate, calcium borate, and calcium molybdate.

5. The flame-retardant polyamide composition according to claim 4, wherein auxiliary flame retardant (D) is a combination of sodium antimonate and anhydrous zinc borate ($2ZnO.3B_2O_3$).

6. A molded article produced through molding the flame-retardant polyamide composition according to claim 1.

7. An electrical part produced through molding the flame-retardant polyamide composition according to claim 1.

8. The flame-retardant polyamide composition according to claim 1, wherein the mass ratio of flame retardant (B1) to flame retardant (B2) is 95/5 to 30/70.

* * * * *